(12) United States Patent
Xu et al.

(10) Patent No.: US 11,862,255 B2
(45) Date of Patent: Jan. 2, 2024

(54) CHARGE LOSS DETECTION USING A MULTIPLE SAMPLING SCHEME

(71) Applicant: Micron Technology, Inc., Boise, ID (US)

(72) Inventors: Jun Xu, San Jose, CA (US); Theodore T. Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 17/666,955

(22) Filed: Feb. 8, 2022

(65) Prior Publication Data

US 2023/0017995 A1 Jan. 19, 2023

Related U.S. Application Data

(60) Provisional application No. 63/223,119, filed on Jul. 19, 2021.

(51) Int. Cl.
*G11C 16/34* (2006.01)

(52) U.S. Cl.
CPC ........ *G11C 16/3431* (2013.01); *G11C 16/349* (2013.01)

(58) Field of Classification Search
CPC .............. G11C 16/3431; G11C 16/349; G11C 11/5642; G11C 16/30; G11C 29/021; G11C 29/025; G11C 29/028; G11C 16/0483; G11C 16/24; G11C 29/44; G11C 29/50004; G11C 2029/1204; G11C 2029/5006; G11C 29/12005; G11C 29/04
See application file for complete search history.

(56) References Cited

U.S. PATENT DOCUMENTS

| | | | |
|---|---|---|---|
| 11,029,890 B1 | 6/2021 | Parthasarathy | |
| 2007/0183196 A1* | 8/2007 | Gendrier | G06F 11/1008 |
| | | | 714/E11.035 |
| 2012/0218833 A1 | 8/2012 | Yamada | |
| 2017/0316834 A1 | 11/2017 | Huynh | |
| 2020/0381063 A1 | 12/2020 | Kavalipurapu | |
| 2023/0057289 A1* | 2/2023 | Kalluru | G11C 29/50008 |

OTHER PUBLICATIONS

The extended European Search Report for EP Application No. 22185774.1, dated Nov. 10, 2022, 9 pages.

\* cited by examiner

*Primary Examiner* — Jay W. Radke
(74) *Attorney, Agent, or Firm* — Lowenstein Sandler LLP

(57) ABSTRACT

A memory device includes a memory array and control logic, operatively coupled with the memory array, to perform operations including causing a first current to be obtained with respect to cells of a wordline maintained at a first voltage, determining that the cells are at a second voltage lower than the first voltage, in response to determining that the cells are the second voltage, causing a voltage ramp down process to be initiated, causing a second current to be sampled with respect to the cells during the voltage ramp down process, and detecting an existence of charge loss by determining whether the second current satisfies a threshold condition in view of the first current.

20 Claims, 10 Drawing Sheets

CHARGE LOSS DETECTION USING A MULTIPLE SAMPLING SCHEME

RELATED APPLICATION

This application claims the benefit of U.S. Provisional Application 63/223,119 filed on Jul. 19, 2021, the entire content of which is incorporated by reference herein.

TECHNICAL FIELD

Embodiments of the disclosure relate generally to memory sub-systems, and more specifically, relate to charge loss detection using a multiple sampling scheme.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
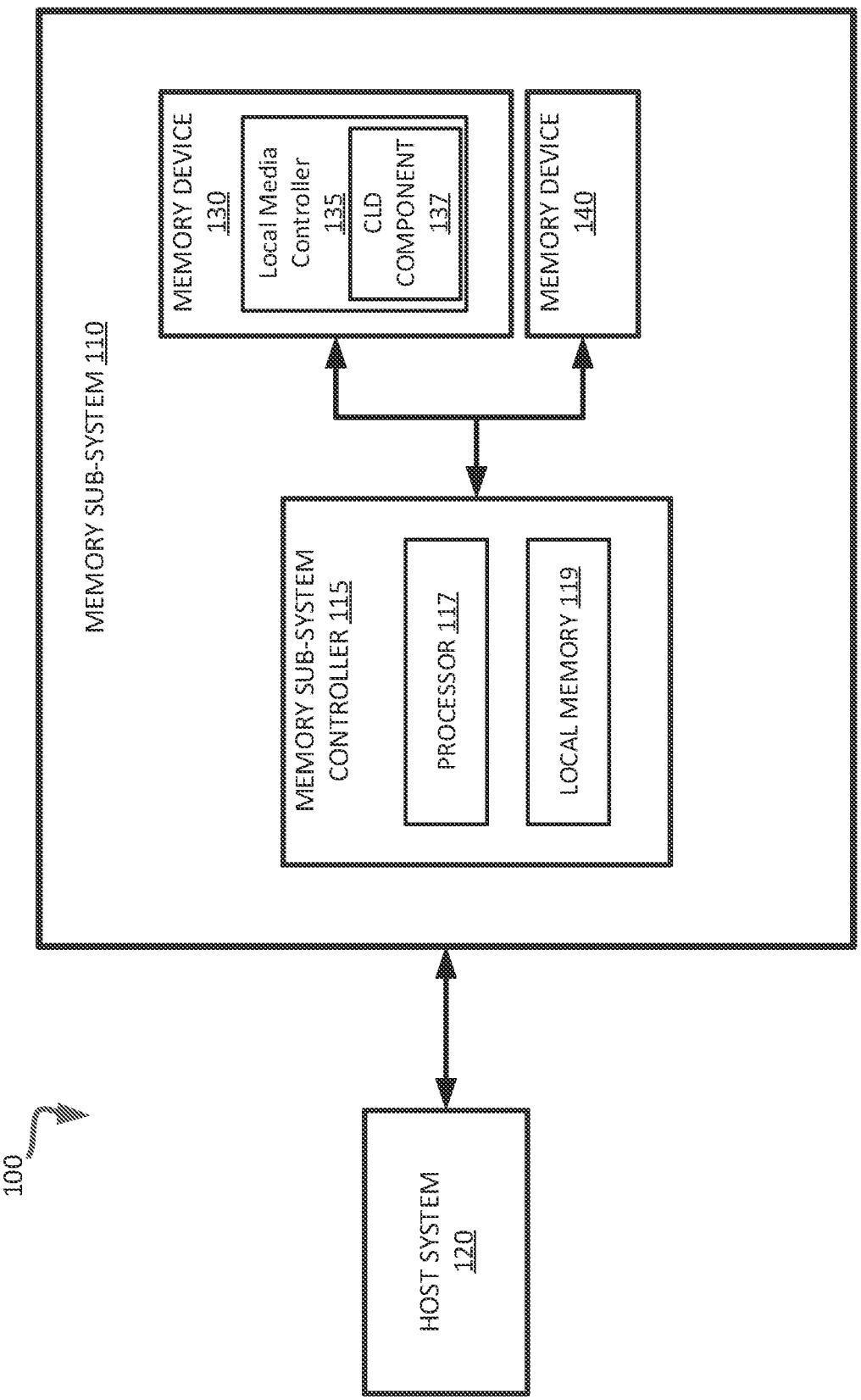
FIG. 1A illustrates an example computing system that includes a memory sub-system in accordance with some embodiments of the present disclosure.

Aspects of the present disclosure are directed to charge loss detection using a multiple sampling scheme. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell, thus determining a voltage signal $V_{CG}$ that has to be applied to a control electrode or control gate of the cell to open the cell to the flow of electric current across the cell, between the source electrode and the drain electrode. More specifically, for each individual memory cell (having a charge Q stored thereon) there can be a corresponding threshold voltage $V_t$ such that the source-drain current is low when the control gate voltage ($V_{CG}$) is less than $V_t$. The source-drain current can increase when $V_{CG}$ exceeds $V_t$. Because the actual geometry of the electrodes and gates varies from cell to cell, the $V_t$'s can be different, even for cells programmed to the same logical value on the same die. The memory cells can, therefore, be characterized by a distribution P of the threshold voltages, $P(Q,V_t)=dW/dV_t$, where dW represents the probability that any given cell has its threshold voltage within the interval $[V_t,V_t+dV_t]$ when charge Q is placed on the cell.

A memory device can have distributions $P(Q,V_t)$ that are narrow compared with the working range of voltage windows tolerated by the cells of the device. Accordingly, multiple distributions $P(Q_k,V_t)$ (with "valleys" between distributions) can be fit into the working voltage window allowing for storing and reliably detecting multiple bits per cell, such as $2^3=8$ distributions (7 valleys) for a TLC, $2^2=4$ distributions (3 valleys) for an MLC, etc. The distributions are interspersed with voltage intervals ("valley margins") between distributions where none (or very few) of the memory cells of the device have their threshold voltages. Such valley margins can, therefore, be used to separate various charge states $Q_k$—the logical state of the cell can be determined by detecting, during a read operation by applying read voltages corresponding to each valley. This effectively allows a single memory cell to store multiple bits of information: a memory cell operated with $2^N$ distributions ("levels") is capable of storing N bits of information. During the read operation, $2^{N-1}$ read voltages can be applied to distinguish the $2^N$ distributions. Specifically, the read operation can be performed by comparing the measured threshold voltage $V_t$ exhibited by the memory cell to one or more reference voltage levels corresponding to known valleys (e.g., centers of the valley) of the memory device One phenomenon observed in memory devices is storage charge loss or slow charge loss (SCL), also referred to herein as charge loss, in which $V_t$ distributions shift towards lower voltage levels as charge diminishes over, e.g., time and/or temperature. That is, the $V_t$ distribution shift can be proportional to the elapsed time from a programming operation to a read operation. With SCL, depending on the system workload, it is possible to have variations in the program-to-read elapsed time across different blocks. These variations can result in varying, non-uniform $V_t$ distribution shifts if programming is spaced significantly in time. As a result of these non-uniform $V_t$ distribution shifts, it can be difficult to determine or predict an optimal read level that can be applied to the majority of the blocks without compromising performance.

During a read operation of a cell (i.e. a "read cell"), a read reference voltage ($V_{ref}$) can be applied to an associated wordline, and a sense amplifier connected to an associated bitline can be used to sense whether the read cell has been switched on. More specifically, if $V_{ref}$ is higher than a threshold voltage ($V_t$) of the read cell, then the read cell is turned on. It is noted that only one cell per bitline can be read at a time. Since the cells of a bitline are connected in series, all transistors for cells of the bitline that are not being read ("unread cells") need to be kept on during the read operation in order for the read output of the read cell to pass-through to the sense amplifier. To achieve this, a pass-through voltage ($V_{pass}R$) can be applied to the wordlines of the unread cells to keep the unread cells activated (i.e., turned on). More specifically, $V_{pass}R$ is a voltage that is chosen to be higher than all of the Vt's of the unread cells, but lower than a programming voltage. Although $V_{pass}R$ is a lower voltage than the programming voltage, the application of $V_{pass}R$ can affect (e.g., increase) the $V_t$'s and thus alter logic states of the unread cells of the block via tunneling currents. This phenomenon is referred to as "read disturb." As more read operations are applied within the block, the accumulation of read disturb over time lead to read disturb errors.

A block can be characterized based on the programming state of its wordlines. For example, an open block refers to a block in which some of the wordlines are not currently programmed (e.g., in an erase state), and a closed block refers to a block in which all of the wordlines are programmed. A block can also be characterized based on age, which can be defined in view of a number of program/erase (P/E) cycles that have been performed with respect to the block. For example, a cycled block refers to a block that has underwent a number of P/E cycles that exceeds a first threshold number of P/E cycles (e.g., an older block), and a fresh block refers to a block that has underwent a number of P/E cycles less than a second threshold number of P/E cycles (e.g., a newer block).

During certain methods to detect pillar resistance for SCL detection, all wordlines can be ramped up together and a pillar current is measured at a power supply voltage (e.g., $V_{REG2}$), the ramp up is until the pillar current is larger than a threshold value. SCL can be detected if a lower wordline voltage is needed to meet the threshold value. To accurately detect SCL, the $V_t$ of cells of a selected wordline ($WL_{sel}$) can be detected directly. For example, voltage of all deselected wordlines can be at $V_{pass}R$, and then the voltage of $WL_{sel}$ can be ramped down to detect the $V_t$ of those cells. However, when detecting the $V_t$ of the cells of the selected wordline, a current of lower Vt cells can be at a saturation current. For example, the current can be a pillar current with respect to a memory device implementing 3D NAND technology. This saturation current can be related to, e.g., open block percentage, temperature and/or number of program/erase cycles.

For example, an open block can have a larger pillar current, and the detection error between a 50% open block and a 0% open block can be about 300 mV. In contrast to an open block, a cycled block can have a smaller pillar current, and the detection error between a cycled block versus an open block can be about 530 mV. Accordingly, methods to measure current may not be accurate for SCL detection of open and/or cycled blocks.

Aspects of the present disclosure address the above and other deficiencies by implementing charge loss detection using a multiple sampling scheme. For example, a first current corresponding to a saturation current (e.g., $V_{passR}$) for cells of a selected wordline ($WL_{sel}$) can be obtained. In some embodiments, obtaining the first current includes sampling the first current. In some embodiments, obtaining the first current includes receiving the first current from an external source. While the cells of deselected wordlines (e.g., lower level cells) are still at the saturation current, a current sampling can be performed repeatedly with respect to the cells of $WL_{sel}$ during a ramp down period until a second current meets a threshold condition, with respect to the first current, that triggers $V_t$ shift detection.

In some embodiments, after obtaining the first current, the voltage of $WL_{sel}$ can be quickly ramped down during a ramp down period to a maximum $V_t$ value for a given valley (programming state) of the $V_t$ distribution. This "fast ramp down" period can be performed to reduce the time it takes to identify the second current and thus detect $V_t$ shift.

A set of read voltages (e.g., $V_{passR}$ and a wordline read-verify voltage ($V_{wlrv}$)) can be adjusted to account for the detected $V_t$ shift. The double sampling can illustratively be used to improve open block and cycled block SCL $V_t$ distribution shift detection. In some embodiments, the charge loss detection described herein can be implemented to sample pillar currents with respect to a memory device implementing 3D NAND technology.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement a charge loss detection (CLD) component 137. The CLD component 137 can implement a double sampling scheme to perform SCL detection. To perform the double sampling scheme, the CLD component 137 can obtain a first sampling current ($I_1$) corresponding to when the cells of all wordlines are at a saturation current (e.g., when the cells are settled at $V_{passR}$). Then, the CLD component 137 can cause a second sampling to be performed with respect to a selected wordline during a ramp down period. SCL detection is triggered in response to determining that the first sampling current and a second sampling current ($I_2$) obtained during the second sampling satisfy a threshold condition. Voltage adjustments can then be made to account for the SCL.

In some embodiments, the CLD component 137 causes a first sampling to be performed to obtain the first sampling current. That is, both the first and second sampling currents can be measured internally within the memory device 130 by the CLD component 137. In some embodiments, the first sampling current can be obtained based on information provided externally with respect to the memory device 130. For example, in a zoned namespace (ZNS) system, the ZNS system can track block status. The ZNS system can provide information related to a block (e.g., openness, age) through a set feature operation (e.g., EFh command). Based on information provided externally with respect to the memory device 130, the CLD component 137 can calculate the first sampling current from a lookup data structure (e.g., lookup table). Further details regarding the operations of the CLD component 137 will be described below with reference to FIGS. 3-5.

Figure 1B:
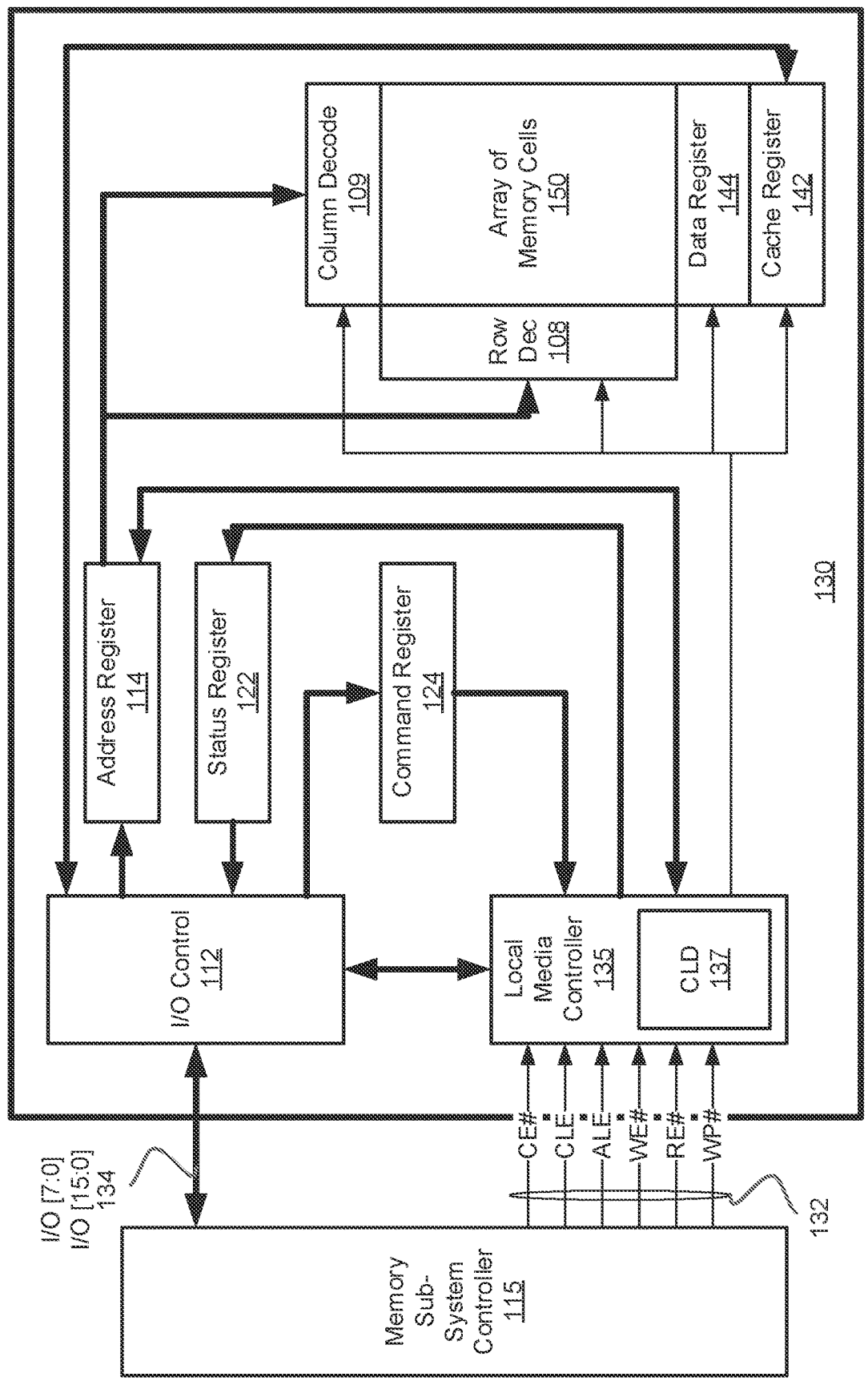
FIG. 1B is a block diagram of a memory device in communication with a memory sub-system controller of a memory sub-system in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 150 are capable of being programmed to one of at least two target data states.

Row decode circuitry 108 and column decode circuitry 109 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 109 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 109 to control the row decode circuitry 108 and column decode circuitry 109 in response to the addresses.

The local media controller 135 is also in communication with a cache register 142. Cache register 142 latches data, either incoming or outgoing, as directed by the local media controller 135 to temporarily store data while the array of memory cells 150 is busy writing or reading, respectively, other data. During a program operation (e.g., write operation), data may be passed from the cache register 142 to the data register 144 for transfer to the array of memory cells 150; then new data may be latched in the cache register 142 from the I/O control circuitry 112. During a read operation, data may be passed from the cache register 142 to the I/O control circuitry 112 for output to the memory sub-system controller 115; then new data may be passed from the data register 144 to the cache register 142. The cache register 142 and/or the data register 144 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

In some embodiments, local media controller 135 includes the CLD component 137 which can detect charge loss by performing double sampling. By causing a first current to be obtained with respect to cells of a wordline maintained at a first voltage, and causing a second current to be sampled with respect to the cells during a ramp down process beginning at a second voltage less than the first voltage, the CLD component 137 can detect the existence of charge loss by determining whether the second current satisfies a threshold condition in view of the first current. For example, the first current can be a saturation current corresponding to a read pass-through voltage ($V_{passR}$), the second voltage can be a maximum threshold voltage ($V_t$) for a particular valley of a $V_t$ distribution. Further details regarding the charge loss detection performed by the CLD component 137 are described below.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 142. The data may be subsequently written into data register 144 for programming the array of memory cells 150.

In an embodiment, cache register 142 may be omitted, and the data may be written directly into data register 144. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
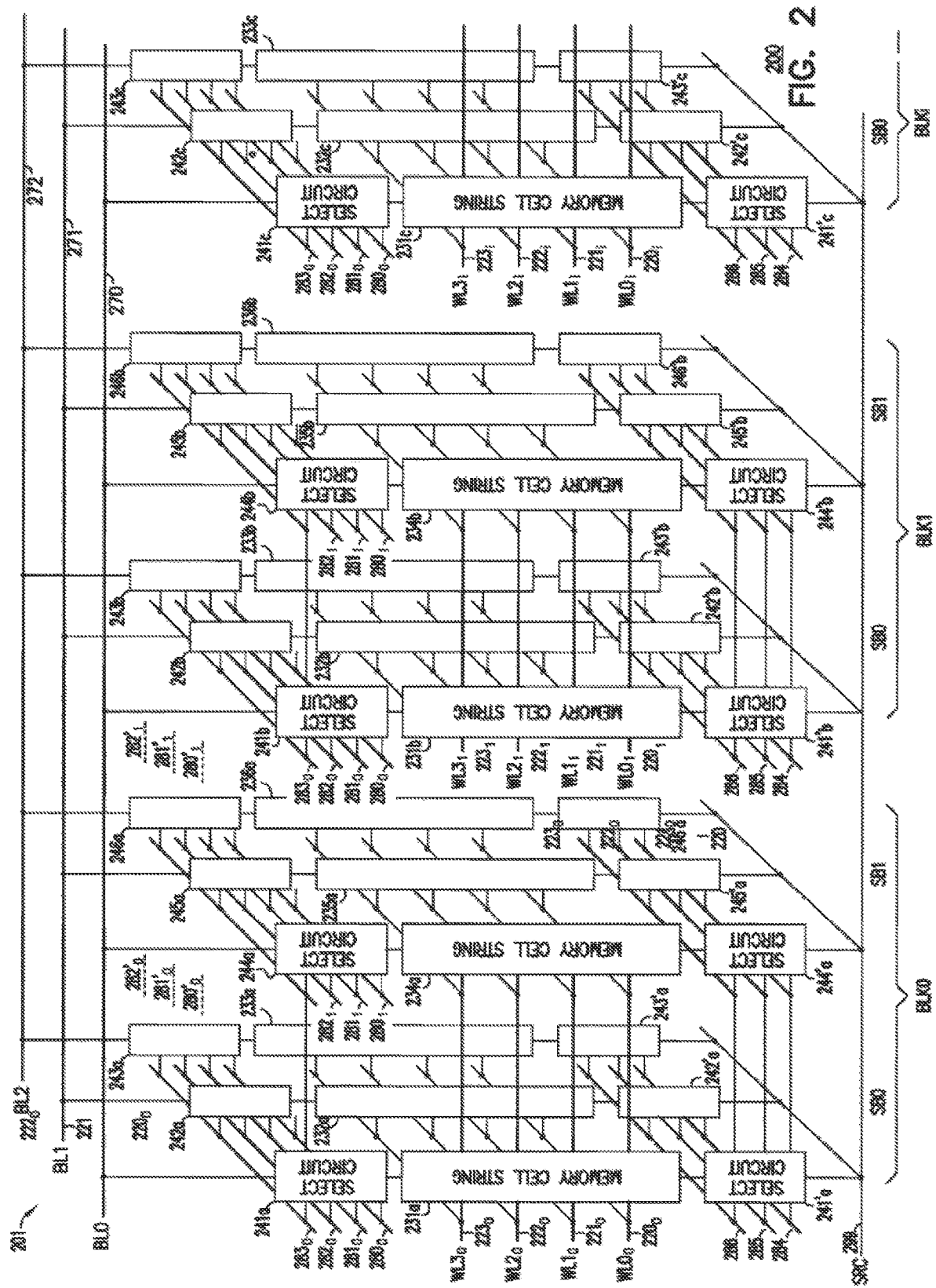
FIG. 2 is a schematic block diagram of a portion of a memory device including a memory array having memory cell strings and associated select circuits and select lines according to some embodiments.

FIG. 2 is a schematic block diagram of a portion of a memory device 200 including a memory array 201 having memory cell strings and associated select circuits and select lines according to some embodiments. Memory device 200 can correspond to memory device 130 of FIGS. 1A-1B. For example, memory array 201 can form part of the array of memory cells 104 of FIG. 1B.

As shown in FIG. 2, memory device 200 can include blocks (blocks of memory cells) BLK0, BLK1, through BLKi. Three blocks are shown as an example. Memory device 200 can include many blocks (e.g., up to thousands or more blocks). In the physical structure of memory device 200, the blocks can be arranged (e.g., formed) one block next to another block, such that each block can have a neighboring block. Neighboring blocks are blocks located immediately (e.g., adjacent) next to each other. For in example, in the physical structure of memory device 200, blocks BLK0 and BLK1 can be neighboring blocks.

Each of blocks BLK0, BLK1 through BLKi of memory device 200 can include (e.g., can be divided into) sub-blocks. For example, each of blocks BLK0 and BLK1 can include sub-blocks SB0 and SB1. Block BLKi can include a sub-block SB0 (and a sub-block SB1, which is not shown). Blocks BLK0, BLK1, through BLKi can include the same number of sub-blocks. FIG. 2 shows an example where each of blocks BLK0, BLK1 through BLKi can include two sub-blocks (e.g., SB0 and SB1). However, each of blocks BLK0, BLK1 through BLKi can have more than two blocks (e.g., SB0, SB1, SB2, SB3, and so on).

As shown in FIG. 2, each sub-block (e.g., SB0 or SB1) has its own memory cell strings, and each of the memory cell strings can be associated with (e.g., coupled to) select circuits. For example, sub-block SB0 of block BLK0 has memory cell strings 231a, 232a, and 233a and associated select circuits (e.g., drain select circuits) 241a, 242a, and 243a, and select circuits (e.g., source select circuits) 241'a, 242'a, and 243'a. Sub-block SB1 of block BLK0 has memory cell strings 234a, 235a, and 236a and associated select circuits (e.g., drain select circuits) 244a, 245a, and 246a, and select circuits (e.g., source select circuits) 244'a, 245'a, and 246'a.

Sub-block SB0 of block BLK1 has memory cell strings 231b, 232b, and 233b, and associated select circuits (e.g., drain select circuits) 241b, 242b, and 243b, and select circuits (e.g., source select circuits) 241'b, 242'b, and 243'b. Sub-block SB1 of block BLK1 has memory cell strings 234b, 235b, and 236b, and associated select circuits (e.g., drain select circuits) 244b, 245b, and 246b, and select circuits (e.g., source select circuits) 244'b, 245'b, and 246'b.

FIG. 2 shows an example of three memory cell strings and their associated circuits in a sub-block (e.g., in sub-block SB0). The number of memory cell strings and their associated select circuits in each the sub-block of blocks BLK0, BLK1, through BLKi can vary. Memory device 200 can include data lines 270, 271, and 272 that carry signals BL0, BL1, and BL2, respectively. Each of data lines 270, 271, and 272 can be structured as a conductive line (which includes conductive materials). The memory cell strings of blocks BLK0, BLK1, through BLKi can share data lines 270, 271, and 272.

For example, memory cell strings 231a, 234a (of block BK0), 231b, 234b (of block BLK1), and 231c (of BLKi) can share data line 270. Memory cell strings 232a, 235a (of block BK0), 232b, 235b (of block BK1), and 232c (of block BLKi) can share data line 271. Memory cell strings 233a, 236a (of block BK0), 233b, 236b (of block BK1), and 233c (of block BKi) can share data line 272. FIG. 2 shows three data lines 270, 271, and 272 as an example. The number of data lines can vary.

Memory device 200 can include a line 299 that can carry a signal SRC (e.g., source line signal). Line 299 can be structured as a conductive line (which includes conductive materials) and can form part of a source (e.g., a source line) of memory device 200. Blocks BLK0, BLK1, through BLKi can share line 299. Alternatively, each of blocks BLK0, BLK1, through BLKi can have its own line (e.g., source) similar to line 299.

Memory device 200 can include access lines in blocks BLK0, BLK1 through BLKi in which the access lines are electrically separated from each other within the same block and electrically separated from block to block. As shown in FIG. 2, each of blocks BLK0, BLK1, BLK2, and BLK3 can include its own access lines associated with signals (e.g., wordline signals) WL0, WL1, WL2, and WL3. For example, in block BLK0, memory device 200 includes access lines (which can be or can include wordlines) $220_0$, $221_0$, $222_0$, and $223_0$ (e.g., a group of access lines) that can carry corresponding signals (e.g., wordline signals) $WL0_0$, $WL1_0$, $WL2_0$, and $WL3_0$, respectively.

In block BLK1, memory device 200 includes access lines (which can be or can include wordlines) $220_1$, $221_1$, $222_1$, and $223_1$ (e.g., a group of access lines) that can carry corresponding signals (e.g., wordline signals) $WL0_1$, $WL1_1$, $WL2_1$, and $WL3_1$, respectively. In block BLKi, memory device 200 includes access lines (which can be or can include wordlines) $220_i$, $221_i$, $222_i$, and $223_i$ that can carry corresponding signals (e.g., wordline signals) $WL0_i$, $WL1_i$, $WL2_i$, and $WL3_i$.

Access lines $220_0$ through $223_0$, $220_1$ through $223_1$, and $220_1$ through $223_1$ can be structured as conductive access lines (which include conductive materials) that can form part of respective access lines of memory device 200 to access memory cells in a respective block. FIG. 2 shows four access lines ($220_0$ through $223_0$, $220_1$ through $223_1$, or $220_1$ through $223_1$) in each of blocks BLK0, BLK1, through BLKi as an example. The number of access lines can vary.

In sub-block SB0 of block BK0, memory device 200 includes select lines (e.g., drain select lines) $280_0$, $281_0$, $282_0$, and $283_0$ that can be shared by select circuits 241a, 242a, and 243a. In sub-block SB1 of block BK0, memory device 200 includes select lines (e.g., drain select lines) $280_1$, $281_1$, $282_1$, and $283_1$ that can be shared by select circuits 244a, 245a, and 246a. Block BLK0 can include select lines (e.g., source select lines) 284, 285, and 286 that can be shared by select circuits 241'a, 242'a, 243'a, 244'a, 245'a, and 246'a.

In sub-block SB0 of block BLK1, memory device 200 includes select lines (e.g., drain select lines) $280_0$, $281_0$, $282_0$, and $283_0$ that can be shared by select circuits 241b, 242b, and 243b. In sub-block SB1 of block BLK1, memory device 200 includes select lines (e.g., drain select lines) $280_1$, $281_1$, $282_1$, and $283_1$ that can be shared by select circuits 244b, 245b, and 246b. Block BLk1 can include select lines (e.g., source select lines) 284, 285, and 286 that can be shared by select circuits 241'b, 242'b, 243'b, 244'b, 245'b, and 246'b. In sub-block SB0 of block BLKi, memory device 200 includes select lines (e.g., drain select lines) $280_0$, $281_0$, $282_0$, and $283_0$ that can be shared by select circuits 241c, 242c, and 243c; and select lines (e.g., source select lines) 284, 285, and 286 that can be shared by select circuits 241'c, 242'c, and 243'c.

FIG. 2 shows an example where memory device 200 includes four drain select lines (e.g., $280_0$, $281_0$, $282_0$, and $283_0$) associated with a drain select circuit (e.g., 241a, 242a, or 243a) in a sub-block (e.g., sub-block SB0 of block BLK0). However, memory device 200 can include fewer or more than four drain select lines associated with a drain select circuit. Similarly, FIG. 2 shows an example where memory device 200 includes three source select lines (e.g., 284, 285, and 286) associated with a source select circuit (e.g., 241'a, 242'a, or 243'a) in a sub-block (e.g., sub-block SB0 of block BLK0). However, memory device 200 can include fewer or more than three source select lines associated with a source select circuit.

Memory device 200 can include connections $280'_0$, $281'_0$, $282'_0$, $283'_0$, $280'_1$, $281'_1$, $282'_1$, $283'_1$, where each of which can electrically connect two respective select lines. FIG. 2 shows connections $280'_0$, $281'_0$, $282'_0$, $283'_0$, $280'_1$, $281'_1$, $282'_1$, $283'_1$ by themselves to avoid crowding the elements shown in FIG. 2. FIG. 2 shows a connection $280'_0$ to indicate select line $280_0$ of sub-block SB0 of block BLK0 (sometimes referred to as select line $280_0$/SB0/BLK0) and select line $280_0$ of sub-block SB0 of block BLK1 (sometimes referred to as select line $280_0$/SB0/BLK1) can be in electrical contact (e.g., can be electrically connected) to each other through connection $280'_0$. Thus, in memory device 200, select lines $280_0$/SB0/BLK0 and $280_0$/SB0/BLK1 can be provided (e.g., applied) with the same signal. This also means that select lines $280_0$/SB0/BLK0 and $280_0$/SB0/BLK1 can receive the same signal during an operation (e.g., read, write, or erase operation) of memory device 200.

FIG. 2 shows a connection $281'_0$ to indicate select line $281_0$ of sub-block SB0 of block BLK0 (sometimes referred to as select line $281_0$/SB0/BLK0) and select line $281_0$ of sub-block SB0 of block BLK1 (sometimes referred to as select line $281_0$/SB0/BLK1) can be in electrical contact (e.g., can be electrically connected) to each other through connection $281'_0$. Thus, in memory device 200, select lines $281_0$/SB0/BLK0 and $281_0$/SB0/BLK1 can be provided (applied) with the same signal. This also means that select lines $281_0$/SB0/BLK0 and $281_0$/SB0/BLK1 can receive the same signal during an operation (e.g., read, write, or erase operation) of memory device 200.

FIG. 2 shows a connection $282'_0$ to indicate select line $282_0$ of sub-block SB0 of block BLK0 (sometimes referred to as select line $282_0$/SB0/BLK0) and select line $282_0$ of sub-block SB0 of block BLK1 (sometimes referred to as select line $282_0$/SB0/BLK1) can be in electrical contact (e.g., can be electrically connected) to each other through connection $282'_0$. Thus, in memory device 200, select lines $282_0$/SB0/BLK0 and $282_0$/SB0/BLK1 can be provided (applied) with the same signal. This also means that select lines $282_0$/SB0/BLK0 and $282_0$/SB0/BLK1 can receive the same signal during an operation (e.g., read, write, or erase operation) of memory device 200.

FIG. 2 shows a connection $283'_0$ to indicate select line $283_0$ of sub-block SB0 of block BLK0 (sometimes referred to as select line $283_0$/SB0/BLK0) and select line $283_1$ of sub-block SB0 of block BLK0 (sometimes referred to as select line $283_1$/SB0/BLK0) can be in electrical contact (e.g., can be electrically connected) to each other through connection $283'_0$. Thus, in memory device 200, select lines $283_0$/SB0/BLK0 and $283_1$/SB0/BLK0 can be provided (applied) with the same signal. This also means that select lines $283_0$/SB0/BLK0 and $283_1$/SB0/BLK1 can receive the same signal during an operation (e.g., read, write, or erase operation) of memory device 200.

FIG. 2 shows a connection $280'_1$ to indicate select line $280_1$ of sub-block SB1 of block BLK0 (sometimes referred to as select line $280_1$/SB1/BLK0) and select line $280_1$ of sub-block SB1 of block BLK1 (sometimes referred to as select line $280_1$/SB1/BLK1) can be in electrical contact (e.g., can be electrically connected) to each other through connection $281'_1$. Thus, in memory device 200, select lines $280_1$/SB1/BLK0 and $280_1$/SB1/BLK1 can be provided (applied) with the same signal. This also means that select lines $280_1$/SB1/BLK0 and $280_1$/SB1/BLK1 can receive the same signal during an operation (e.g., read, write, or erase operation) of memory device 200.

FIG. 2 shows a connection $281'_1$ to indicate select line $281_1$ of sub-block SB1 of block BLK0 (sometimes referred to as select line $281_1$/SB1/BLK0) and select line $281_1$ of sub-block SB1 of block BLK1 (sometimes referred to as select line $281_1$/SB1/BLK1) can be in electrical contact (e.g., can be electrically connected) to each other. Thus, in memory device 200, select lines $281_1$/SB1/BLK0 and $281_1$/SB1/BLK1 can be provided (applied) with the same signal. This also means that select lines $281_1$/SB1/BLK0 and $281_1$/SB1/BLK1 can receive the same signal during an operation (e.g., read, write, or erase operation) of memory device 200.

FIG. 2 shows a connection $282'_1$ to indicate select line $282_1$ of sub-block SB1 of block BLK0 (sometimes referred to as select line $282_1$/SB1/BLK0) and select line $282_1$ of sub-block SB1 of block BLK1 (sometimes referred to as select line $282_1$/SB1/BLK1) can be in electrical contact (e.g., can be electrically connected) to each other through connection $282'_1$. Thus, in memory device 200, select lines $282_1$/SB1/BLK0 and $282_1$/SB1/BLK1 can be provided (applied) with the same signal. This also means that select lines $282_1$/SB1/BLK0 and $282_1$/SB1/BLK1 can receive the same signal during an operation (e.g., read, write, or erase operation) of memory device 200.

FIG. 2 shows a connection $283'_1$ to indicate select line $283_1$ of sub-block SB0 of block BLK0 (sometimes referred to as select line $283_1$/SB0/BLK0) and select line $283_1$ of sub-block SB0 of block BLK0 (sometimes referred to as select line $283_1$/SB0/BLK0) can be in electrical contact (e.g., can be electrically connected) to each other through connection $283'_1$. Thus, in memory device 200, select lines $283_1$/SB0/BLK0 and $283_1$/SB0/BLK0 can be provided (applied) with the same signal. This also means that select lines $283_1$/SB0/BLK0 and $283_1$/SB0/BLK0 can receive the same signal during an operation (e.g., read, write, or erase operation) of memory device 200.

In the structure of memory device 200, each of connections $280'_0$, $281_0$, $282'_0$, $283'_0$, $280'_1$, $281_1$, $282'_1$, $283'_1$ can include a conductive material that is formed to be in electrical contact with the materials of two respective select lines. For example, connection $283'_0$ can include a conductive material that is formed to be in electrical contact with the material that form select lines $283_0$/SB0/BLK0 and the material that form select line $283_1$/SB0/BLK0. In another example, connection $282'_0$ can include a conductive material that is formed to be in electrical contact with the material that forms select lines $282_0$/SB0/BLK0 and the material that form select line $282_1$/SB0/BLK0.

The material (or materials) of each of connection $280'_0$, $281_0$, $282'_0$, $283'_0$, $280'_1$, $281_1$, $282'_1$, $283'_1$ can include metal, doped polysilicon, or other conductive materials. Each of the drain select circuits of memory device 200 can include multiple drain select gates connected in series (e.g., four transistors connected in series) between a respective data line and a respective memory cell string. The drain select gates can be controlled (e.g., turned on or turned off) by respective drain select lines based on voltages provided to the signals on the respective drain select lines. Each of the source select circuits of memory device 200 can include multiple source select gates connected in series between line 299 and a respective memory cell string. The source select gates can be controlled (e.g., turned on or turned off) by respective source select lines based on voltages provided to the signals on the respective source select lines.

In FIG. 2, each of the memory cell strings of memory device 200 has memory cells arranged in a string (e.g., coupled in series among each other) to store information. During an operation (e.g., read, write, or erase operation) of memory device 200, the memory cell strings can be individually selected to access the memory cells in the selected memory cell string in order to store information in or read information from the selected memory cell string. One or both select circuits (a drain select circuit and a source select circuit) associated with a selected memory cell string can be activated (e.g., by turning on the select gates (e.g., transistors) in the select circuit (or selected circuits)), depending on which operation memory device 200 performs on the selected memory cell string.

Activating a particular select circuit among the select circuits of memory device 200 during an operation of memory device 200 can include providing (e.g., applying) voltages having certain values to the signals on select lines associated with that particular select circuit. When a particular drain select circuit of memory device 200 is activated, it can electrically connect (e.g., form a current path from) a selected memory cell string associated with that particular select circuit to a respective data line (e.g., one of data lines 270, 271, or 272). When a particular source select circuit is activated, it can electrically connect (e.g., form a current path from) a selected memory cell string associated with that particular select circuit to a source (e.g., line 299).

Figure 3:
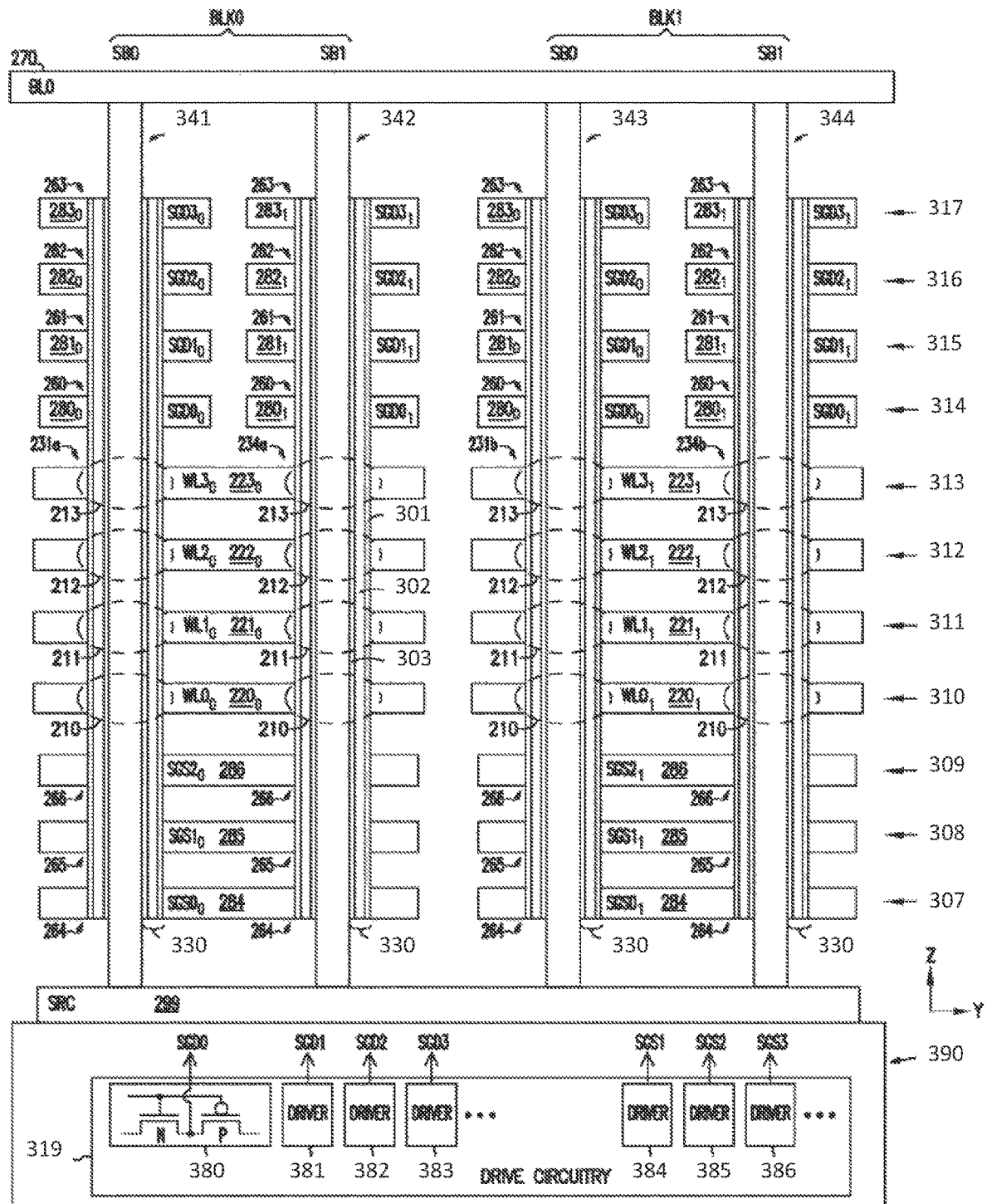
FIG. 3 is a side view of a structure of a portion of the memory device of FIG. 2, according to some embodiments.

FIG. 3 is a side view of a structure of a portion of the memory device 200 of FIG. 2, according to some embodiments. As shown in FIG. 3, memory device 200 can include a substrate 390 over which memory cells 210, 211, 212, and 213 of memory cell strings 231a, 234a, 231b, and 234b of respective sub-blocks SB0 and SB1 of blocks BLK0 and BLK1 can be formed (e.g., formed vertically in z-direction with respect to line 299 and substrate 390). Memory device 200 includes different levels 307 through 317 with respect to a z-direction. Levels 307 through 317 are internal device levels between substrate 390 and data line 270.

Substrate 390 of memory device 200 can include monocrystalline (also referred to as single-crystal) semiconductor material. For example, substrate 390 can include monocrystalline silicon (also referred to as single-crystal silicon). The monocrystalline semiconductor material of substrate 390 can include impurities, such that substrate 390 can have a specific conductivity type (e.g., n-type or p-type).

Memory device 200 can include drive circuitry 319 to provide signals (e.g., drain and source select line signals) to respective select lines of memory device 200. Drive circuitry 319 can correspond to or be included in the local media controller 135 of FIGS. 1A-1B. Although not shown in FIG. 3, substrate 390 can include circuitry that can be located directly under line 299. Such circuitry can include sense amplifiers, buffers (e.g., page buffers), decoders, and other circuit components of memory device 200. As shown in FIG. 3, drive circuitry 319 can include drivers (driver circuits) 380, 381, 382, and 383 to provide respective signals (e.g., drain select line signals SGD0, SGD1, SGD2, and SGD3), and drivers (driver circuits) 384, 385, and 386 to provide respective signals (e.g., source select line signals SGS0, SGS1, and SGS2). In FIG. 3, only some of the drain and source select signals are shown for simplicity.

In FIG. 3, each of drivers 380 through 386 can include two transistor N (e.g., NMOS) and P (e.g., p-channel MOS (PMOS)). For simplicity, detail of only one of drivers 380 through 384 is shown in FIG. 3. Each of drivers 380 through 386 can include an output node, e.g., a node located between and electrically connected to transistors N and P, to provide (e.g., drive) a respective signal (e.g., a drain select line signal or a source select line signal). The output node of each of drivers 380 through 386 can be coupled to (e.g., electrically connected to) a respective drain select line or a respective source select line of memory device 200. This allows the drain and source select line signals (e.g., SGD0, SGD1, SGD2, SGD3, SGS0, SGS1, and SGS2) from drive circuitry 319 to be provided to respective drain and source select lines of memory device 200 as described above with reference to FIG. 2 and FIG. 3.

FIG. 3 shows an example where each of drivers 380 through 386 can have two transistors of different transistor types (e.g., NMOS and PMOS) coupled in a complementary MOS (CMOS) connection. However, each of drivers 380 through 386 can have two transistors of the same types (e.g., two NMOS transistors or two PMOS transistors) and two separate transistor gate signals. Further, the number of transistors in each of drivers 380 through 386 may be different from two.

As shown in FIG. 3, data line 270 can have a length extending in the y-direction (e.g., shown in FIG. 3), which is perpendicular to the z-direction and the x-direction. Data line 270 can include a conductive material (e.g., conductively doped polycrystalline silicon (doped polysilicon), metals, or other conductive materials). Further, line 299 can include a conductive material and can have a length extending in the y-direction. FIG. 3 shows an example where line 299 (e.g., source) can be formed over a portion of substrate 390 (e.g., by depositing a conductive material over substrate 390). Alternatively, line 299 can be formed in or formed on a portion of substrate 390 (e.g., by doping a portion of substrate 390).

In some embodiments, select lines (e.g., drain select lines) $280_0$, $281_0$, $282_0$, and $283_0$ of each of blocks BLK0 and BLK1 can be located in respective levels 314, 315, 316, and 317. Select lines (e.g., drain select lines) $280_1$, $281_1$, $282_1$, and $283_1$ of each of blocks BLK0 and BLK1 can be located in respective levels 314, 315, 316, and 317.

In some embodiments, memory cells 210, 211, 212, and 213 of memory cell strings 231a, 234a, 231b, and 234b can be located in levels 310, 311, 312, and 313, respectively. Access lines $220_0$, $221_0$, $222_0$, and $223_0$ (associated with memory cells 210, 211, 212, and 213, respectively) of block BLK0 can be located in levels 310, 311, 312, and 313, respectively. Access lines $220_1$, $221_1$, $222_1$, and $223_1$ (associated with memory cells 210, 211, 212, and 213, respectively) of block BLK1 can be located in levels 310, 311, 312, and 313, respectively.

Select lines (e.g., source select lines) 284, 285, and 286 of each of blocks BLK0 and BLk1 can be located in different levels (e.g., levels 307, 308, and 309, respectively) between substrate 390 and memory cell strings 231a, 232a, and 233a. Memory device 200 can also include dielectric materials (not labeled in FIG. 3) interleaved with other elements in different levels of memory device 200. For example, memory device 200 can include dielectric materials (e.g., silicon dioxide) located between levels 314 and 317 and interleaved with (located in the spaces between) select lines $280_0$, $281_0$, $282_0$, and $283_0$ of each of blocks BLK0 and BLK1. In another example, memory device 200 can include a group of dielectric materials (e.g., silicon dioxide) located between levels 310 and 313 and interleaved with (located in the spaces between) access lines $220_0$, $221_0$, $222_0$, and $223_0$ of block BLK0. In another example, memory device 200 can include a group of dielectric materials (e.g., silicon dioxide) located between levels 310 and 313 and interleaved with (located in the spaces between) access lines $220_1$, $221_1$, $222_1$, and $223_1$ of block BLK1.

In another example, memory device 200 includes dielectric materials (e.g., silicon dioxide) located between levels 307 and 309 and interleaved with (located in the spaces between) select lines 284, 385, and 286. The materials of select lines $280_0$, $281_0$, $282_0$, $283_0$, $280_1$, $281_1$, $282_1$, $283_1$, 284, 285, and 286 can include conductively doped polycrystalline silicon, metals, or other conductive materials and can be the same as the conductive material of access lines $220_0$, $221_0$, $222_0$, $223_0$, $220_1$, $221_1$, $222_1$, and $223_1$. As shown in FIG. 3, memory device 200 can include pillars (conductive pillars) pillars 341, 342, 343, and 344 in respective sub-blocks SB0 and SB1 of blocks BLK0 and BLK1. Each of pillars 341, 342, 343, and 344 can have length extending outwardly (e.g., vertically in the direction of the z-direction and perpendicular to the y-direction). Each of pillars 341, 342, 343, and 344 can contact a conductive region of the material that forms part of data line 270 and contact a conductive region of the material that forms part of line 299.

Each of pillars 341, 342, 343, and 344 can include a material (or materials) to form a conductive path (e.g., a channel) between data line 270 and line 299. Such a material (e.g., undoped or doped polycrystalline silicon) of each of pillars 341, 342, 343, and 344 can be part of a channel (not shown in FIG. 3) of a respective pillar among pillars 341, 342, 343, and 344.

As shown in FIG. 3, memory device 200 can include a structure 330 adjacent a respective pillar of pillars 341, 342, 343, and 344 and extending continuously along a length of the respective pillar. Structure 330 is also adjacent portions of respective access lines ($220_0$, $221_0$, $222_0$, and $223_0$, or access lines $220_1$, $221_1$, $222_1$, and $223_1$). Structure 330 adjacent a respective pillar is located between the respective pillar and portions of respective access lines (access lines $220_0$, $221_0$, $222_0$, and $223_0$, or access lines $220_1$, $221_1$, $222_1$, and $223_1$). Structure 330 can include portions 301, 302, and 303. Parts of structure 330 along a particular pillar can form part of each of memory cells of the memory cell string adjacent that particular pillar. For example, structure 330 adjacent pillar 342 can form part of each of memory cells 210, 211, 212, and 213 of memory cell string 234a. Thus, each of memory cells 210, 211, 212, and 213 of a memory cell string can include part of structure 330 (part of each of portions 301, 302, and 303) located directly between one of the access lines (one of access lines $220_0$, $221_0$, $222_0$, and $223_0$, $220_1$, $221_1$, $222_1$, and $223_1$) and a respective pillar. For example, memory cell 212 of memory cell string 243a (adjacent pillar 342) can include part of each of portions 301, 302, and 303 located directly between access line $222_0$ and pillar 342.

Structure 330 can be part of a TANOS (TaN, $Al_2O_3$, $Si_3N_4$, $SiO_2$, Si) structure. For example, portion 301 (e.g., interpoly dielectrics) can include a charge blocking material or materials (e.g., a dielectric material such as TaN and $Al_2O_3$) that are capable of blocking a tunneling of a charge. Portion 302 can include a charge storage element (e.g., charge storage material or materials, such as $Si_3N_4$) that can provide a charge storage function (e.g., trap charge) to represent a value of information stored in memory cells 210, 211, 212, or 213. Portion 303 can include a dielectric, such as a tunnel dielectric material or materials (e.g., $SiO_2$) that are capable of allowing tunneling of a charge (e.g., electrons). As an example, portion 303 can allow tunneling of electrons from portion 304 to portion 302 during a write operation and tunneling of electrons from portion 302 to portion 304 during an erase operation of memory device 200. Moreover, portion 303 can allow tunneling of holes from portion 304 to portion 302, compensating the trapped electron recombination during an erase operation of memory device 200. In an alternative arrangement of memory device 200, structure 330 can be part of a SONOS (Si, $SiO_2$, $Si_3N_4$, $SiO_2$, Si) structure. In another alternative arrangement, structure 330 can be part of a floating gate structure (e.g., portion 302 can be polysilicon and each of portions 301 and 303 can be dielectric (e.g., $SiO_2$).

As shown in FIG. 3, a select line (e.g., $280_0$) is a piece (e.g., a single layer) of conductive material (e.g., polycrystalline silicon, metal, or other conductive materials). As described above, a select line can carry a signal (e.g., signal $SGD1_0$) but it does not operate like a switch (e.g., a transistor). A select gate (e.g., 260) can include a portion of a respective select line (e.g., a portion of the piece of the conductive material that forms the respective select line) and additional structures to perform a function (e.g., function of a transistor). For example, in FIG. 3, select gate 260 of sub-block SB0 of block BLK0 can include a portion of select line $280_0$ sub-block SB0 of block BLK0 and a portion of structure 330 (along pillar 341) adjacent select line $280_0$ of sub-block SB0 of block BLK0. In another example, select gate 261 of sub-block SB0 of block BLK0 can include a portion of select line $281_0$ sub-block SB0 of block BLK0 and a portion of structure 330 (along pillar 341) adjacent select line $281_0$ of sub-block SB0 of block BLK0.

FIG. 3 shows an example where select gates 261 through 266 have the same structure (e.g., TANOS structure) as memory cells 210, 211, 212, and 213. Alternatively, select gates 260, 261, 262, and 263 (e.g., drain select gate), select gates 264, 265, and 266 (e.g., source select gate), or select gates 260 through 266 can have a different structure, such as a FET structure. As is known to those skilled in the art, an FET usually includes a transistor gate, a transistor body channel, and a gate oxide between the transistor gate and the transistor body channel that can be in direct contact with the transistor gate and the transistor body channel.

Figure 4:
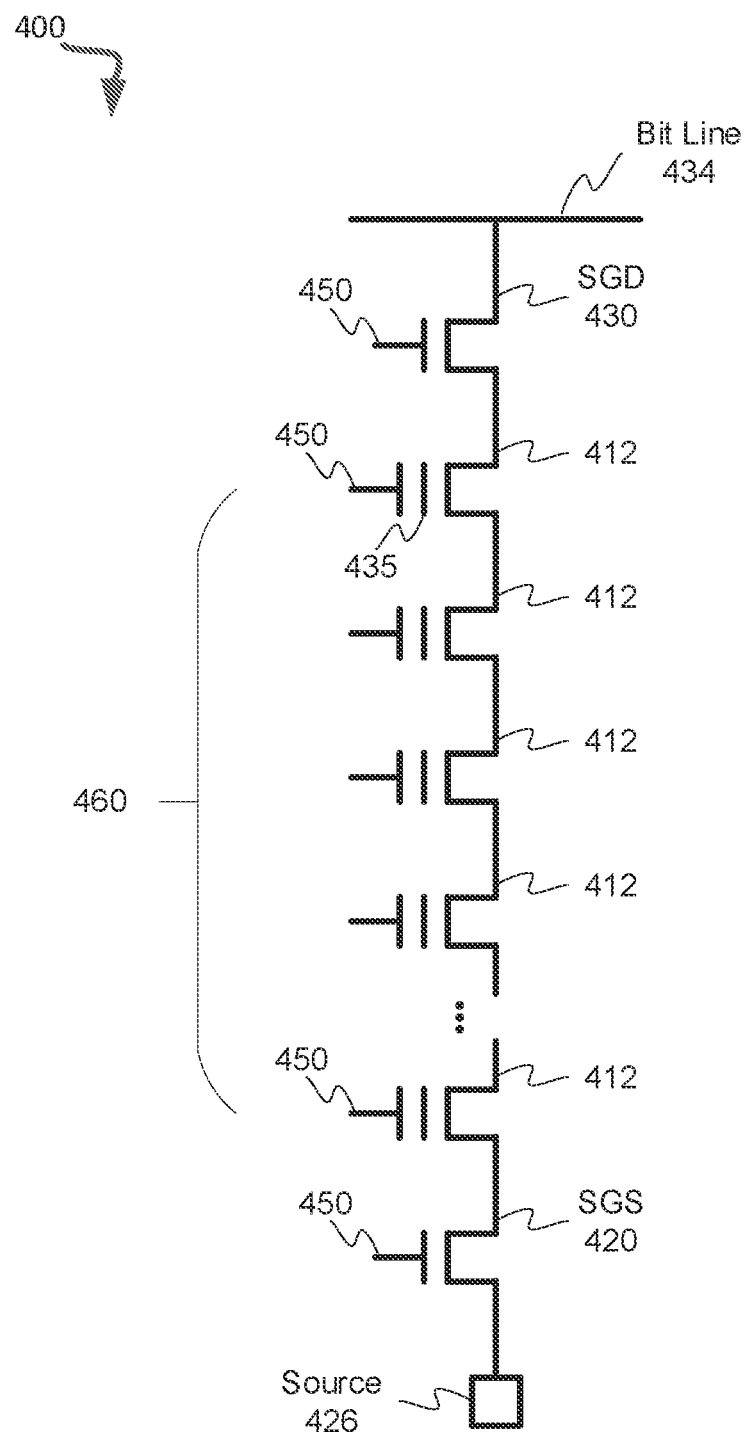
FIG. 4 is a schematic diagram illustrating a string of memory cells in a data block of a memory device in a memory sub-system in accordance with some embodiments of the present disclosure.

FIG. 4 is a schematic diagram illustrating a string 400 of memory cells in a data block of a memory device in a memory sub-system in accordance with some embodiments of the present disclosure. In one embodiment, the string 400 is representative of one portion of memory device 130, such as from array of memory cells 150, as shown in FIG. 1B. The string 400 includes a number of memory cells 412 (i.e., charge storage devices), such as up to 32 memory cells (or more) in some embodiments. The string 400 includes a source-side select transistor known as a select gate source 420 (SGS) (typically an n-channel transistor) coupled between a memory cell 412 at one end of the string 400 and a common source 426. The common source 426 may include, for example, a commonly doped semiconductor material and/or other conductive material. At the other end of the string 400, a drain-side select transistor called a select gate drain 430 (SGD) (typically an n-channel transistor) is coupled between one of the memory cells 412 and a data line 434, which is commonly referred to in the art as a "bit line." The common source 426 can be coupled to a reference voltage (e.g., ground voltage or simply "ground" [GND]) or a voltage source (e.g., a charge pump circuit or power supply which may be selectively configured to a particular voltage suitable for optimizing a programming operation, for example).

Each memory cell 412 may include, for example, a floating gate transistor or a charge trap transistor and may comprise a single level memory cell or a multilevel memory cell. The floating gate may be referred to as a charge storage structure 435. The memory cells 412, the source select gate 420, and the drain select gate 430 can be controlled by signals on their respective control gates 450.

Control signals can be applied to select lines (not shown), to select strings, or to access lines (not shown) to select memory cells 412, for example. In some cases, the control gates can form a portion of the select lines (for select devices) or access lines (for cells). The drain select gate 430 receives a voltage that can cause the drain select gate 430 to select or deselect the string 400. In one embodiment, each respective control gate 450 is connected to a separate wordline (i.e., access line), such that each device or memory cell can be separately controlled. The string 400 can be one of multiple strings of memory cells in a block of memory cells in memory device 130. For example, when multiple strings of memory cells are present, each memory cell 412 in string 400 may be connected to a corresponding shared wordline, to which a corresponding memory cell in each of the multiple strings is also connected. As such, if a selected memory cell in one of those multiple strings is being read, a corresponding unselected memory cell 412 in string 400 which is connected to the same wordline as the selected cell can be subjected to the same read voltage, potentially leading to read disturb effects.

Figure 5:
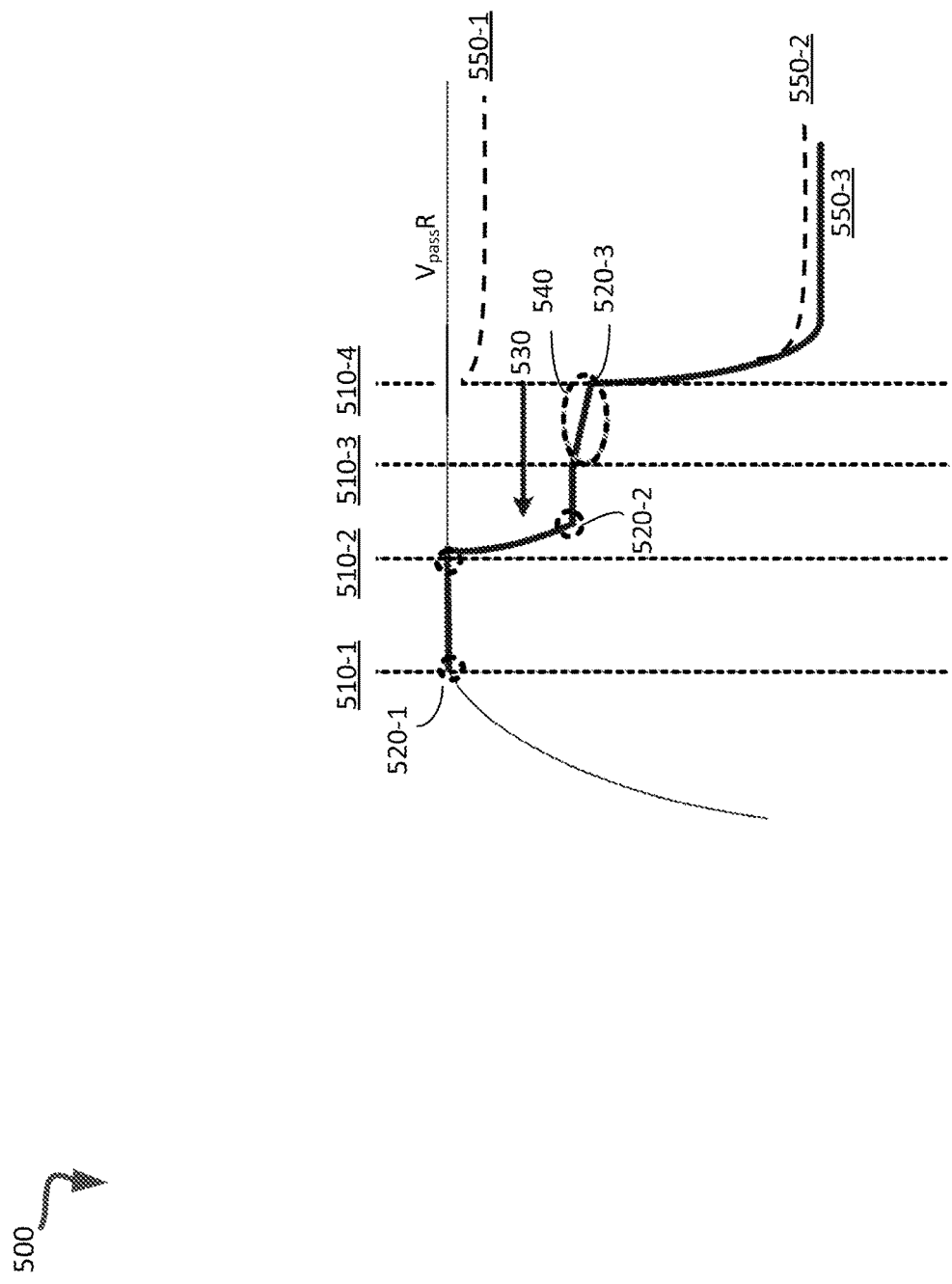
FIG. 5 is a diagram illustrating the performance of charge loss detection using a multiple sampling scheme in accordance with some embodiments of the present disclosure.

FIG. 5 is a diagram 500 illustrating the performance of charge loss detection (e.g., SCL detection) using a multiple sampling scheme, in accordance with some embodiments of the present disclosure. As shown, at the beginning of a read operation, voltage of a selected wordline ($WL_{sel}$) is ramped to an initial voltage 520-1 at a first time 510-1. In some embodiments, the initial voltage is $V_{passR}$. For example, the initial voltage 520-1 can be about 7 V.

At a second time 510-2, which is a time corresponding to a delay after the first time 510-1 when the voltage of $WL_{sel}$ is determined to be settled at the initial voltage 520-1, a first sampling current ($I_1$) corresponding to a saturation current is obtained. More specifically, $I_1$ can be an internal pillar current measurement. The voltage of $WL_{sel}$ can be determined to be settled at $V_{passR}$ using any suitable technique. For example, an output of a wordline voltage regulator can be used to determine if the voltage of the cells is stable.

In some embodiments, $I_1$ is obtained by performing a current sampling operation at the second time 510-2. In some embodiments, $I_1$ can be received externally. For example, $I_1$ can be provided by a controller that knows the saturation current by tracking block age (e.g., P/E cycles), block openness, etc.

Illustratively, the delay between time 510-1 and time 510-2 can be between about 1 microsecond (μs) and about 5 μs. For example, the delay between time 510-1 and time 510-2 can be about 3 μs. The value of $I_1$ can depend on whether the block corresponding to the cells is an open block or a non-open (e.g., cycled) block. For example $I_1$ can be larger for an open block relative to a non-open block.

Additionally, as further shown, a first ramp down period 530 is initiated at the second time 510-2 to ramp down the voltage of $WL_{sel}$ from $V_{passR}$ to a second voltage 520-2 during a first portion of a delay between the second time 510-2 and a third time 510-3. The first ramp down period 530 can be an optional quick ramp down period that saves $V_t$ shift detection time. However, the first ramp down period 530 can be performed at any suitable speed in accordance with the embodiments described herein. Once the voltage of $WL_{sel}$ is ramped down to the second voltage 520-2, the voltage of $WL_{sel}$ can be maintained about the second voltage 520-2 until the third time 510-3. During this process, voltage of any unselected wordlines can be maintained at the initial voltage 520-1.

The ramp down during the second ramp down period 540 can be controlled to be performed at a desired speed, and the second sampling can be performed repeatedly during the second ramp down period 540 until charge loss detection is triggered. There is a relationship between desired ramp down speed and charge loss detection accuracy. For example, the slower the ramp down speed, the finer the granularity in sampling currents, which translates into a slower charge loss detection process with higher accuracy. In contrast, the higher the ramp down speed, the coarser the granularity in sampling currents, which translates into a quicker charge loss detection process with lower accuracy. Accordingly, the ramp down speed during the second ramp down period 540 can be selected to achieve a desired tradeoff between performance and accuracy.

However, the maximum $V_t$ for the target valley may have been reduced since the time of programming due to a shift of the $V_t$ distribution resulting from charge loss. To perform charge loss detection, as further shown, a second ramp down period 540 is initiated at time 510-3 to ramp down the second voltage 520-2 until a third voltage 520-3 (indicative of the $V_t$ shift of the maximum $V_t$) is determined that corresponds to the charge loss detection. The charge loss detection can be triggered by determining that a second sampling current ($I_2$) obtained during the second sampling satisfies a threshold condition relative to $I_1$. More specifically, the second sampling current can be an internal pillar current measurement.

In some embodiments, the charge loss detection is triggered by determining that $I_2$ is equal to some predefined value determined as a function of $I_1$. For example, the charge loss detection can be triggered in response to determining that $I_2 = R \times I_1 + I_{offset}$, where R is a value indicative of the target valley, and $I_{offset}$ is an offset current value. R can be a ratio of an index of the target valley ("M") to the total number of valleys ("N"). For example, for a QLC cell having 16 total program states or valleys, if the index of the target valley is 15, then R=M/N=15/16. As another example, if the index of the target valley is 13, then R=13/16. It may be desirable to choose the highest valley of the $V_t$ distribution as the target valley, since the highest valley is generally the most sensitive to charge loss effects.

The ramp down during the second ramp down period 540 can be controlled to be performed at a desired speed, and the second sampling can be performed repeatedly during the ramp down until charge loss detection is triggered. There is a relationship between desired ramp down speed and charge loss detection accuracy. For example, the slower the ramp down speed, the finer the granularity in sampling currents, which translates into a slower charge loss detection process with higher accuracy. In contrast, the higher the ramp down speed, the coarser the granularity in sampling currents, which translates into a quicker charge loss detection process with lower accuracy. Accordingly, the ramp down speed during the second ramp down period 540 can be selected to achieve a desired tradeoff between performance and accuracy.

To further improve accuracy of charge loss detection, additional sampling can be performed with respect to one or more other valleys of the $V_t$ distribution by repeating the steps performed between time 510-2 and time 510-4. For example, charge loss detection can be performed with respect to valleys 15 and 5.

After charge loss detection is triggered, read voltage adjustments can then be made to account for the charge loss resulting in voltages 540-1 through 540-3. For example, the read voltage adjustments can include adjustments to $V_{passR}$ and/or a wordline read-verify voltage ($V_{wlrv}$). Accordingly, the double sampling performed herein can be used to dynamically calibrate read voltages to improve read performance.

Figure 6:
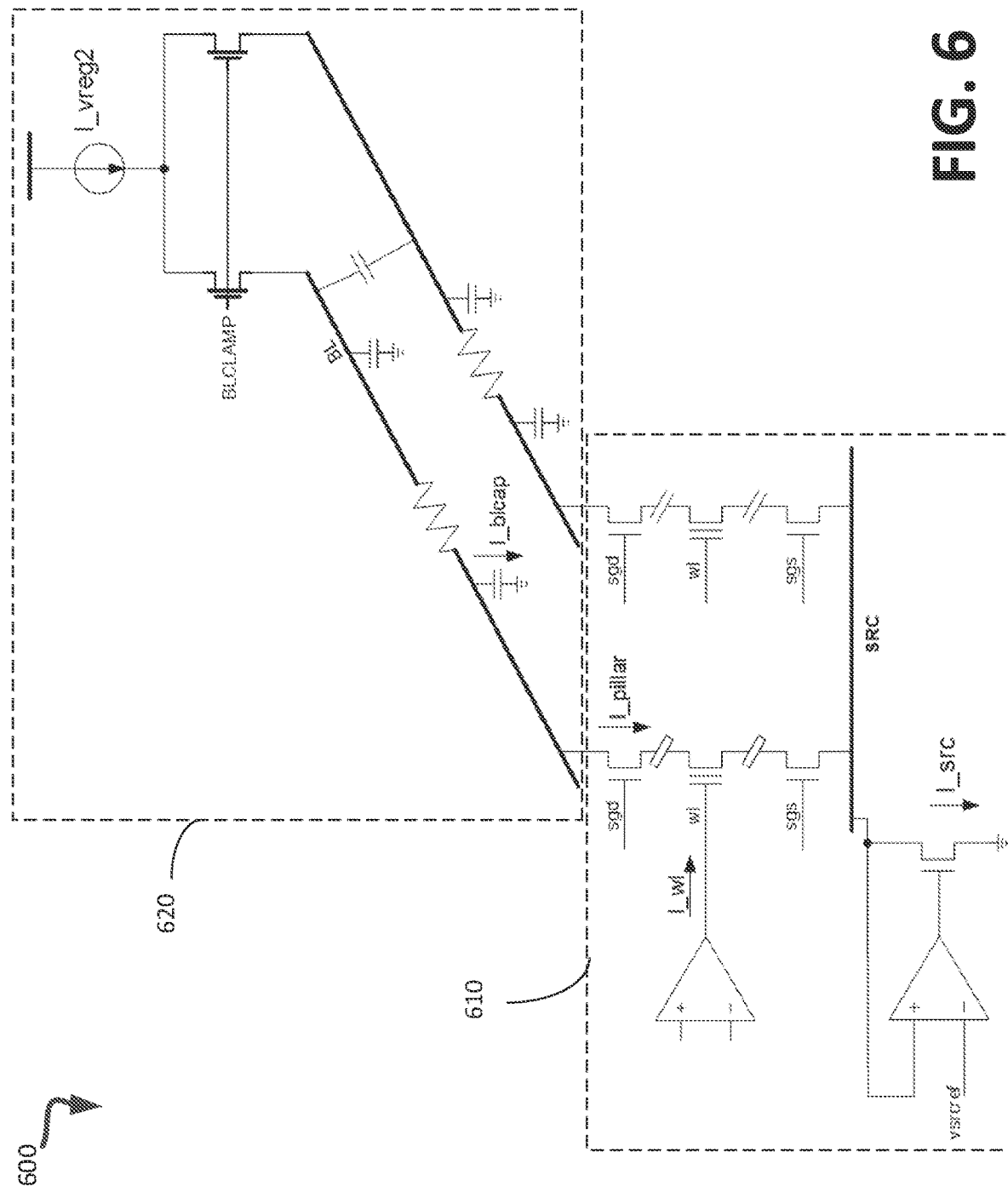
FIG. 6 is a schematic diagram illustrating circuitry to perform charge loss detection using a multiple sampling scheme in accordance with some embodiments of the present disclosure.

FIG. 6 is a schematic diagram illustrating circuitry 600 to obtain sampling currents to perform charge loss detection (e.g., SCL detection) using a multiple sampling scheme, in accordance with some embodiments of the present disclosure. In this example, the sampling currents can be obtained as internal pillar current measurements.

For example, sampling can be performed using a source line (SRC) portion 610 of the circuitry 600. More specifically, the SRC portion 610 can include a SRC regulator. To do so, a source line current (I_src) can be determined as the sum of a wordline current (I_wl) and a pillar current (I_pillar). That is, I_src=I_wl+I_pillar. I_wl can include the current of all sub-blocks and/or chunks of the corresponding block. However, I_wl is generally small when the cells of the wordline are slowly ramping during the second ramp down period (e.g., as described above with reference to FIG. 5). For example, I_wl=10 microamperes (μA). By sampling using the SRC portion 610, there is no need to wait for bitline settling.

As another example, sampling can be performed from a bitline portion 620 of the circuitry 600. To do so, a current corresponding to a regulated voltage, in this example $V_{reg2}$ (I_vreg2), can be determined as the sum of I_pillar and a bitline capacitor current (I_blcap). That is, I_vreg2=I_pillar+I_blcap. In contrast to sampling performed using the SRC portion 610, sampling using the bitline portion 420 can require waiting for bitline settling. Bitline settling can be limited by a bitline clamping circuit (BLCLAMP) that keeps the bitline at a constant voltage (which can reduce read disturb errors). In some embodiments, as will be described in further detail below with reference to FIG. 7, the bitline portion 620 can include a bitline voltage regulator (VBL_REG) to improve bitline settling speed.

Figure 7:
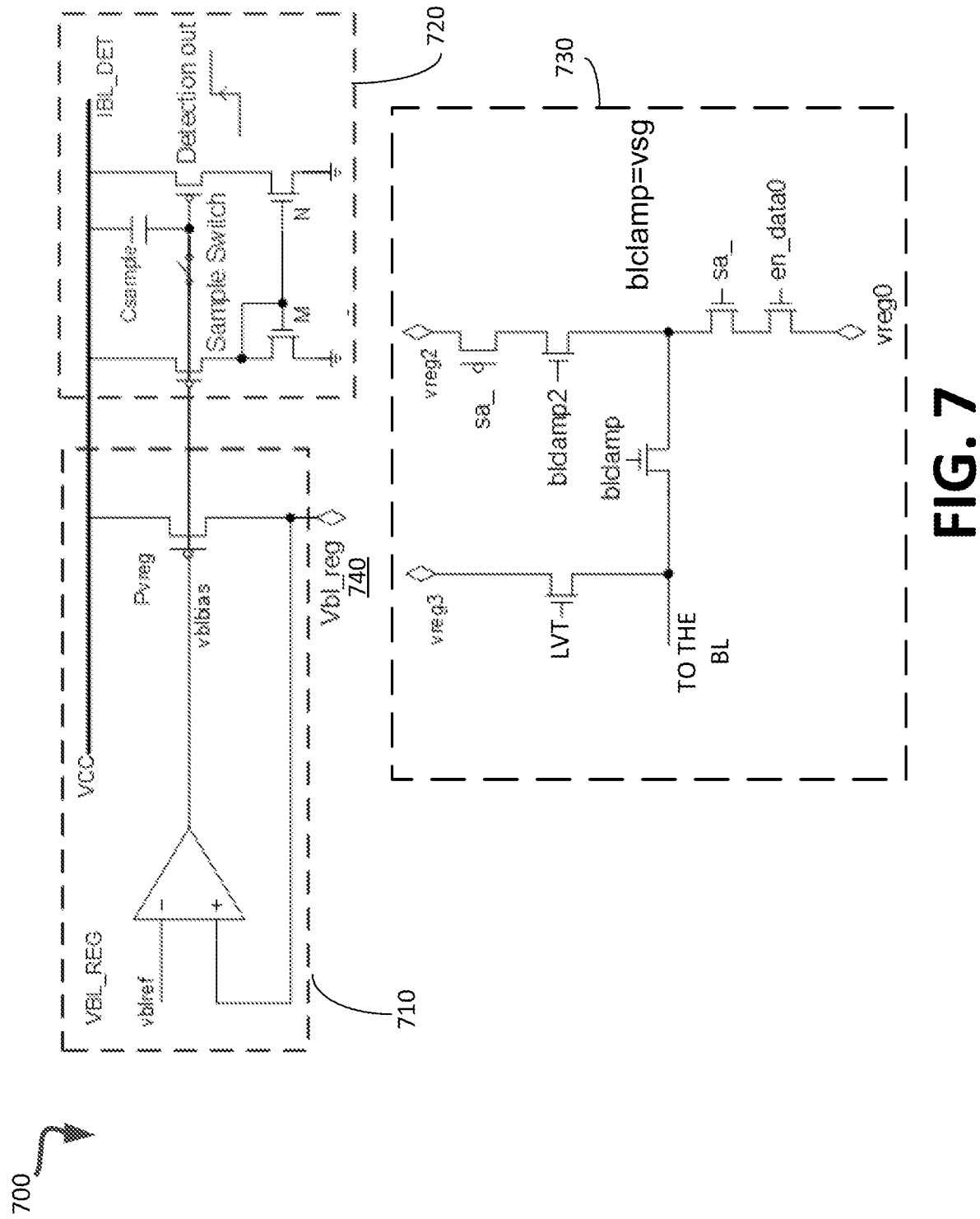
FIG. 7 is a schematic diagram illustrating circuitry to perform charge loss detection using a multiple sampling scheme in accordance with some embodiments of the present disclosure.

FIG. 7 is a schematic diagram illustrating circuitry 700 to obtain sampling currents to perform charge loss detection (e.g., SCL detection) using a multiple sampling scheme, in accordance with some embodiments of the present disclosure. In this example, the sampling currents can be obtained as internal pillar current measurements at a bitline portion (similar to the bitline portion 620 of the circuitry 600 of FIG. 6).

As shown, the circuitry 700 includes a bitline voltage regulator (VBL_REG) portion 710 connected to a voltage common collector supply voltage (VCC). The VLB_REG portion 710 forces a bitline voltage to improve bitline settling speed. For example, the VBL_REG portion 710 can include an amplifier configured to receive a reference bitline voltage (vblref) and an input regulator voltage (vblreg), and output a bitline voltage bias (vblbias).

The circuitry 700 further includes a bitline current detector (IBL_DET) portion 720 connected to VCC. Although the IBL_DET portion 720 is shown being connected to the VBL_REG 710 portion, the IBL_DET portion 720 can alternatively be connected to a source line (SRC) portion (similar to the SRC portion 610 of the circuitry 600 of FIG. 6). The IBL_DET portion 720 measures a sample current, and uses a sample switch to control charge loss detection based on the sample current. For example, the IBL_DET portion 720 includes transistors M and N, where the ratio of M and N can correspond to the value R from the threshold equation $I_2=R \times I_1 + I_{offset}$ (e.g., M/N=15/16).

The circuitry 700 further includes a bitline clamp portion 730. The bitline clamp portion 730 can be part of a static page buffer (SPB) that used to sense data from a bitline and used as a page buffer. The bitline clamp portion 730 includes a number of voltage regulator (vreg) sections each connected to a source/drain of a bitline clamp transistor (blclamp). For example, as shown, the blclamp portion 730 includes a vreg0 section, a vreg2 section and a vreg3 section. The vreg0 section includes a transistor corresponding to an enabling signal (en_data0) and a transistor corresponding to a sense amplifier signal (sa_). The vreg2 section includes a transistor corresponding to a second bitline clamp (blclamp2) and a transistor corresponding to the sense amplifier signal (sa_). The vreg3 section includes a low voltage transistor (LVT) (e.g., an NMOS low voltage transistor).

As shown, the input regulator voltage (vblreg) used to generate vblbias in VBL_REG portion 710 can be obtained from Vbl_reg 740. Vbl_reg 740 can connect to any suitable vreg section of the bitline clamp portion 730 to connect the VBL_REG portion 710 to the bitline. In some embodiments, Vbl_reg 740 is connected to vreg0. In some embodiments, Vbl_reg 740 is connected to vreg2. In some embodiments, Vbl_reg 740 is connected to vreg3. By using the circuitry 700, the bitline settling speed can be determined based on bitline resistance-capacitance (RC) delay, and is thus not limited by bitline clamp transconductance.

Figure 8:
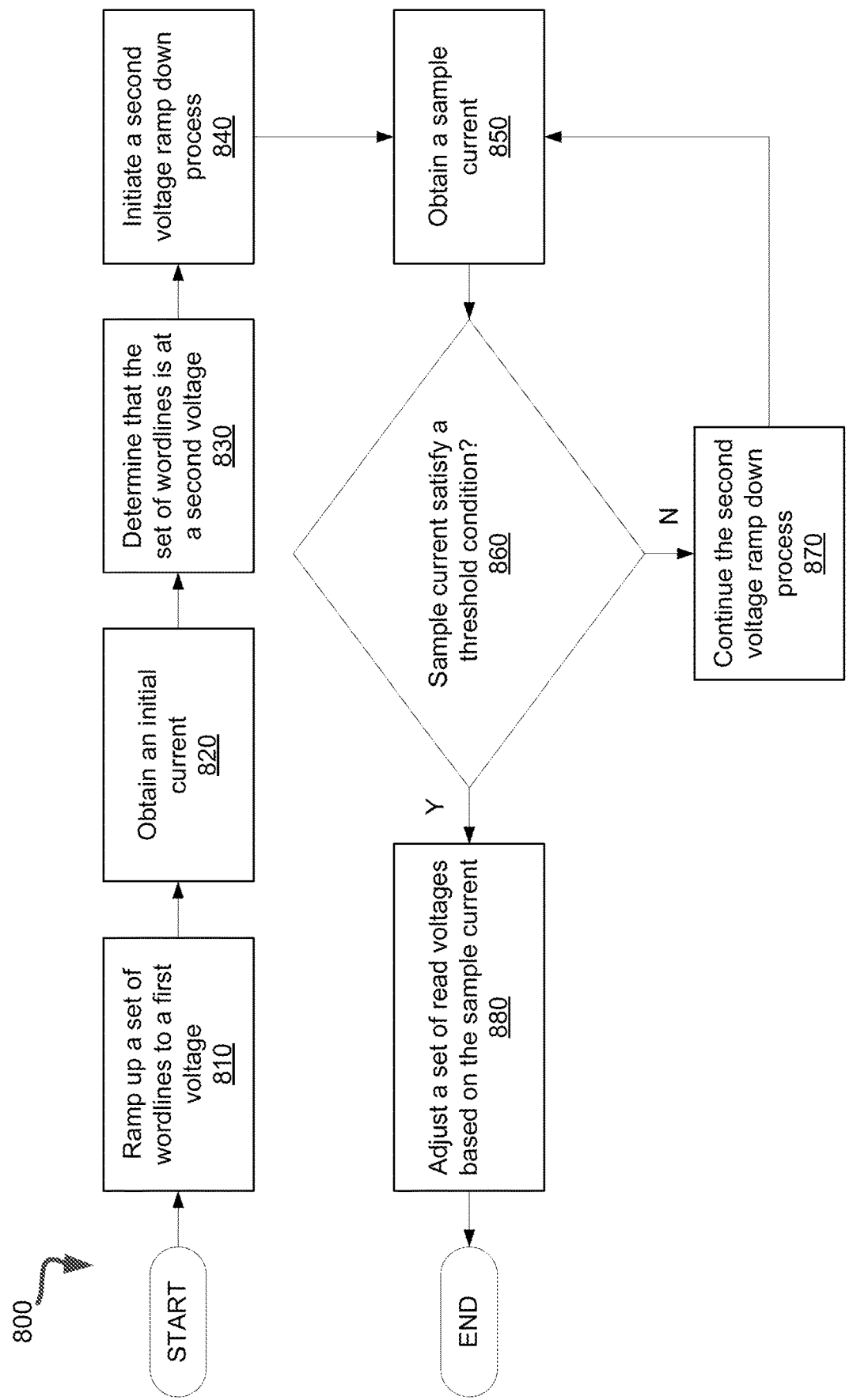
FIG. 8 is a flow diagram of a method to perform charge loss detection using a multiple sampling scheme in accordance with some embodiments of the present disclosure.

FIG. 8 is a flow diagram of an example method 800 to perform charge loss detection using a multiple sampling scheme in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the CLD component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, a set of wordlines is ramped up to a first voltage. For example, the processing logic can cause each wordline of the set of wordlines to be ramped up to the first voltage at a first time. In some embodiments, the first voltage is $V_{passR}$. The set of wordlines are within a block of a memory device. For example, the block can be an open block, a cycled block, etc. In some embodiments, the cells of the set of wordlines include QLC cells. However, such an embodiment should not be considered limiting.

At operation 820, an initial current is obtained. For example, the processing logic can cause a first current sampling to be performed to obtain the initial current at a second time after the first time. The second time can be a time in which the cells of the set of wordlines are settled at $V_{passR}$, such that the cells of the set of wordlines are at a saturation current. For example, the first current can be an internal pillar current. As another example, the processing logic can obtain the initial sample current externally without sampling (e.g., from a controller maintain information regarding of the block). In this example, time savings can be achieved relative to performing the first current sampling (e.g., about 1.5 μs faster).

At operation 830, it is determined that the set of wordlines is at a second voltage. For example, the processing logic can determine that the each wordline of the set of wordlines is at the second voltage at some time after the initial current is obtained. In some embodiments, the second voltage corresponds to a maximum threshold voltage ($V_t$) of a valley of a $V_t$ distribution. For example, if the cells of the selected wordline include QLC cells, then the maximum $V_t$ of the valley can correspond to valley or programming state 15.

In some embodiments, the processing logic can cause a first voltage ramp down process to be performed from the first voltage to achieve the second voltage. The first voltage ramp down process can be a quick ramp down process to reduce the amount of time needed to perform the charge loss detection.

At operation 840, a second voltage ramp down process can be initiated. For example, the processing logic can cause the second voltage ramp down process to be initiated to begin ramping down the second voltage. The second voltage ramp down can be slower than the first voltage ramp down.

At operation 850, a sample current is obtained. For example, the processing logic can cause a current sampling to be performed to obtain the sample current during the second voltage ramp down.

At operation 860, it is determined whether the sample current satisfies a threshold condition. For example, the processing logic can determine whether the sample current satisfies threshold condition based on the initial current. In some embodiments, the processing logic can determine if the sample current satisfies the threshold condition if $I_2 = M \times I_1 + I_{offset}$, where $I_2$ is the sample current, $I_1$ is the initial current, M is a ratio of the index number of the valley to the total number of valleys, and $I_{offset}$ is a current offset value.

If the sample current does not satisfy the threshold condition, then the second voltage ramp down continues at operation 870, and the process reverts back to operation 850 to obtain another sample current at another voltage during the second voltage ramp down process. Otherwise, if the sample current satisfies the threshold condition, this means that charge loss detection has been triggered. Thus, at operation 880, a set of read voltages is adjusted based on the sample current. For example, the processing logic can cause an adjustment to at least one of $V_{passR}$ or $V_{wlrv}$. The set of read voltages is adjusted in order to account of the detected charge loss, which can reduce read errors resulting from $V_t$ distribution shift.

The operations performed at operations 830-860 can be repeated to enable a multiple sampling scheme. For example, the multiple sampling scheme can involve sampling with respect to one or more additional valleys of the $V_t$ distribution. The multiple sampling scheme can take more time to perform, but can provide improvement to charge loss detection accuracy as compared to sampling with respect to a single valley of the $V_t$ distribution.

Figure 9:
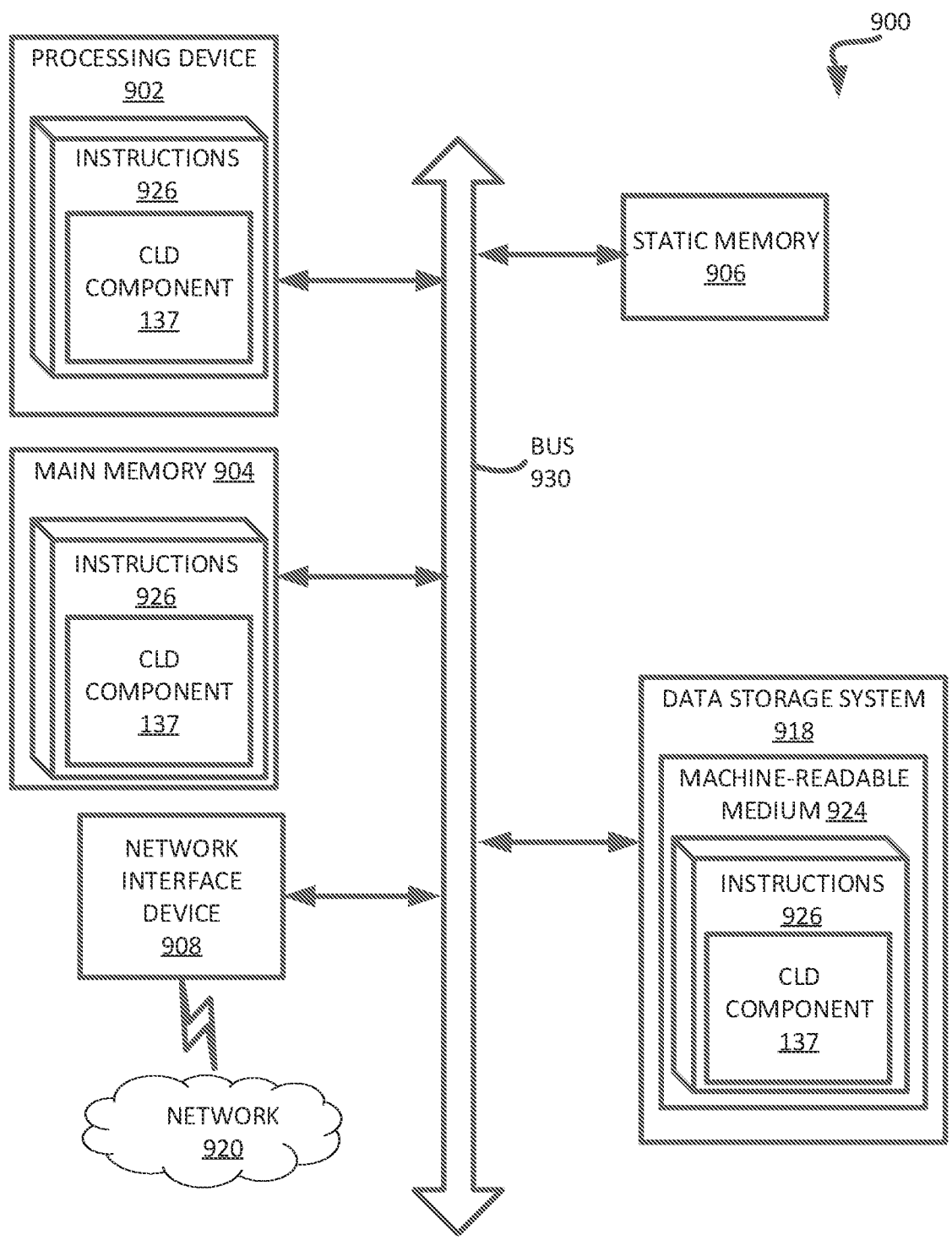
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the CLD component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or RDRAM, etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 702 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to a CLD component (e.g., the CLD component 137 of FIG. 1A). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array; and
   control logic, operatively coupled with the memory array, to perform operations comprising:
   causing a first current to be sampled with respect to cells of a wordline, wherein the wordline is maintained at a first voltage;
   causing a second voltage ramp down process to be initiated;
   causing a second current to be sampled with respect to the cells during the second voltage ramp down process; and
   detecting an existence of charge loss by determining whether the second current satisfies a threshold condition with respect to the first current.

2. The memory device of claim 1, wherein the memory array is a three-dimensional (3D) NAND device memory array, and wherein the first current and the second current are pillar currents.

3. The memory device of claim 1, wherein the first voltage is a read pass-through voltage ($V_{passR}$).

4. The memory device of claim 1, wherein determining whether the second current satisfies the threshold condition comprises determining whether the second current has a value that is proportional to a value of the first current based on a ratio between an index number of a particular valley of a threshold voltage ($V_t$) distribution, and a total number of valleys of the $V_t$ distribution.

5. The memory device of claim 1, wherein the operations further comprise:
   prior to causing the second voltage ramp down process to be initiated, causing a first voltage ramp down process to be performed to ramp down a voltage of the wordline to the first voltage.

6. The memory device of claim 1, wherein the operations further comprise:
   in response to determining that the second current satisfies the threshold condition, detecting the existence of charge loss, and causing an adjustment to a set of read voltages based on the second current to address the charge loss.

7. The memory device of claim 1, wherein the operations further comprise:
   in response to determining that the second current does not satisfy the threshold condition, continuing the second voltage ramp down process, and causing a third current to be sampled with respect to the cells during the second voltage ramp down process.

8. A method comprising:
   causing a first current to be sampled with respect to cells of a wordline of a memory array, wherein the wordline is maintained at a first voltage;
   causing a second voltage ramp down process to be initiated;
   causing a second current to be sampled with respect to the cells during the second voltage ramp down process; and
   detecting an existence of charge loss by determining whether the second current satisfies a threshold condition with respect to the first current.

9. The method of claim 8, wherein the memory array is a three-dimensional (3D) NAND device memory array, and wherein the first current and the second current are pillar currents.

10. The method of claim 8, wherein the first voltage is a read pass-through voltage ($V_{passR}$).

11. The method of claim 8, wherein determining whether the second current satisfies the threshold condition comprises determining whether the second current has a value that is proportional to a value of the first current based on a ratio between an index number of a particular valley of a threshold voltage ($V_t$) distribution, and a total number of valleys of the $V_t$ distribution.

12. The method of claim 8, further comprising:
   prior to causing the second voltage ramp down process to be initiated, causing a first voltage ramp down process to be performed to ramp down a voltage of the wordline to the first voltage.

13. The method of claim 8, further comprising:

in response to determining that the second current satisfies the threshold condition, detecting the existence of charge loss, and causing an adjustment to a set of read voltages based on the second current to address the charge loss.

14. The method of claim 8, further comprising:

in response to determining that the second current does not satisfy the threshold condition, continuing the second voltage ramp down process, and causing a third current to be sampled with respect to the cells during the second voltage ramp down process.

15. A memory device comprising:

a memory array; and control logic, operatively coupled with the memory array, to perform operations comprising:

causing a voltage of a wordline to be maintained at a second voltage corresponding to a maximum threshold voltage ($V_t$) for a particular valley of a $V_t$ distribution;

causing a second voltage ramp down process to be initiated;

causing a second current to be sampled with respect to cells of the wordline during the second voltage ramp down process; and detecting an existence of charge loss by determining whether the second current has a value that is proportional to a value of a first current based on a ratio between an index number of the particular valley of the $V_t$ distribution and a total number of valleys of the $V_t$ distribution.

16. The memory device of claim 15, wherein the memory array is a three-dimensional (3D) NAND device memory array, and wherein the first current and the second current are pillar currents.

17. The memory device of claim 15, wherein the operations further comprise:

in response to determining that the second current has a value that is proportional to the value of the first current, detecting the existence of charge loss, and causing an adjustment to a set of read voltages based on the second current to address the charge loss.

18. The memory device of claim 15, wherein the operations further comprise:

in response to determining that the second current does not satisfy the threshold condition, continuing the second voltage ramp down process, and causing a third current to be sampled with respect to the cells during the second voltage ramp down process.

19. The memory device of claim 15, wherein the operations further comprise:

prior to causing the second voltage ramp down process to be initiated, causing a first voltage ramp down process to be performed to ramp down the voltage of the wordline from a first voltage to the second voltage.

20. The memory device of claim 19, wherein the second voltage is a read pass-through voltage ($V_{passR}$).

\* \* \* \* \*